United States Patent
Chiu et al.

(10) Patent No.: US 7,448,129 B2
(45) Date of Patent: Nov. 11, 2008

(54) PEEL-OFF PLATE FOR AN ELECTRONIC-PART DELIVERY SYSTEM

(75) Inventors: Cheng-Wei Chiu, Taoyuan (TW); Kuo-Chou Cheng, Taipei Hsien (TW); Chin-Chan Chen, Taipei (TW); En-Hsien Lee, Taipei Hsien (TW); Wei-Sheng Hung, Taipei Hsien (TW)

(73) Assignee: Asustek Computer, Inc., Taipei (TW)

( * ) Notice: Subject to any disclaimer, the term of this patent is extended or adjusted under 35 U.S.C. 154(b) by 404 days.

(21) Appl. No.: 10/874,581

(22) Filed: Jun. 24, 2004

(65) Prior Publication Data

US 2005/0014293 A1  Jan. 20, 2005

(30) Foreign Application Priority Data

Jun. 27, 2003  (TW) ............... 92211824 U

(51) Int. Cl.
*B23P 19/00*  (2006.01)

(52) U.S. Cl. ............... 29/762; 29/739; 29/740; 29/426.1; 29/827; 226/128

(58) Field of Classification Search ............... 29/827, 29/762, 33, 33 QS; 156/584, 334; 242/563, 242/563.2; 226/128, 136, 139
See application file for complete search history.

(56) References Cited

U.S. PATENT DOCUMENTS

| | | | | |
|---|---|---|---|---|
| 5,658,384 A | * | 8/1997 | Imlay, Jr. ............... | 118/200 |
| 6,032,845 A | * | 3/2000 | Piccone et al. ............... | 226/139 |
| 6,162,007 A | * | 12/2000 | Witte ............... | 414/416.01 |
| D481,283 S | * | 10/2003 | Watson et al. ............... | D8/90 |
| 6,631,868 B2 | * | 10/2003 | Miller et al. ............... | 242/563 |
| 7,062,211 B2 | * | 6/2006 | Baba et al. ............... | 399/323 |
| 2005/0014293 A1 | * | 1/2005 | Chiu et al. ............... | 438/1 |

\* cited by examiner

*Primary Examiner*—Minh Trinh
(74) *Attorney, Agent, or Firm*—Birch, Stewart, Kolasch & Birch, LLP

(57) ABSTRACT

A peel-off device for an electronic-part delivery system has a front end portion and a recess that is indented inwardly from the front end portion, that is formed through upper and lower surfaces of the front end portion and that has a width larger than that of an electronic part of predetermined specification.

9 Claims, 3 Drawing Sheets

PEEL-OFF PLATE FOR AN ELECTRONIC-PART DELIVERY SYSTEM

This Non-provisional application claims priority under 35U.S.C. § 119(a) on Patent Application No(s). 092211824 filed in Taiwan on Jun. 27, 2003, the entire contents of which are hereby incorporated by reference.

FIELD OF THE INVENTION

The present invention relates to an electronic part feeder, more specifically to a peel-off device for the electronic part feeder.

BACKGROUND OF THE INVENTION

In order to compromise with the advancement in integrated printed circuit production, more and more electronic components are designed and constructed into microelectronic parts so as to enhance the efficiency of the integrated printed circuit. Under this condition, an electronic component, which is mounted on the integrated printed circuit by the conventional THT (through hole technology) assembly method, occupies a relatively large space on the printed circuit since the size of the electronic component cannot be minimized further. The THT assembly method includes a step of drilling a through hole in the printed circuit board in order to permit insertion of a mounting leg of the electronic component. The electronic components therefore occupy a large space on both sides of the printed circuit board. The soldering spot conducted at the respective hole in order to secure the leg of the electronic component relative to the integrated printed circuit is relatively large.

Presently, SMT (surface mounted technology) is used to mount the microelectronic parts on the integrated printed circuit. There is no need of drilling through holes in the printed circuit board and the microelectronic parts can be attached on the same side of the printed circuit board by soldering means. Alternatively, the microelectronic parts can be soldered on both sides of the integrated printed circuit in order to enhance maximum use of space and efficiency thereof. The mounting technology (SMT) costs lesser manufacture expense in comparison with the conventional mounting THT method. The trench to reduce the size of the microelectronic parts from 0603(1.6×0.8×0.45 mm) specification to 0402(1×0.5×0.35 mm) specification is inevitable, because the microelectronic part of 0402 specification occupies a space lesser than one half of the microelectronic part of 0603 specification. Thus, there arise several difficulties when mounting of the microelectronic parts onto the integrated printed circuit is conducted by means of SMT.

FIG. 1 is a fragmentary view of a specific delivery system 10 for delivering the microelectronic parts of 0603 or 0402 specifications to a predetermined position during assembly of electronic parts so as to form an electronic device, such as a motherboard. As illustrated, the delivery system 10 includes a planar supply tray 12, a conveyer belt disposed at one side of the supply tray 12 for conveying a band carrier 14 to a predetermined position, and a peel-off device 16.

Referring to FIG. 2, a perspective view, illustrating interrelationship among the band carrier 14, a transparent tape 18 and the peel-off device 16. The band carrier 14 is formed with a row of uniformly spaced-apart retention recesses 141, within which pluralities of microelectronic parts 20 are disposed respectively. The band carrier 14 is further formed with a row of circular thorough holes 142 which are to be hooked by the conveyer belt so as to bring along the band carrier 14 together therewith when the conveyer belt moves toward the predetermined position. In order to prevent untimely removal of the microelectronic parts 20, the transparent tape 18 overlaps the band carrier 18 so as to cover and protect the microelectronic parts 20. Since the outer surface of each of the microelectronic parts 20 is coated with adhesive means, the transparent tape 18 is prevented from undesired removal from the band carrier 14. The peel-off device 16 is disposed above the conveyer belt, and has a front end portion contacting forcibly and slidably the band carrier 14 so as to remove the transparent tape 18 from the band carrier 14 into a first direction when the band carrier 14 moves with respect to the peel-off device 16 in a second direction opposite to the first direction, thereby exposing the microelectronic parts 20. Upon reaching the predetermined position, the respective microelectronic part 20 is picked up by a suction device (not shown), and is then transferred by a machine arm (not shown) onto a respective integrated printed circuit for securing thereto.

Referring to FIG. 3, one drawback of the aforesaid delivery system 10 resides in that during the tape peeling operation, the microelectronic part 20 may turn upside down due to collision between the peel-off device 16 and a leading end of the respective microelectronic part 20. The swift running of the band carrier 14 results in a sudden upside down turning of the respective microelectronic part 20 upon collision against the front end of the peel-off device 16. When such things happen, the microelectronic part 20 is mounted incorrectly on the respective printed circuit. Since the top and bottom ends of each of the microelectronic parts 20 are marked with different colors (such as black and white), the incorrectness is visible vividly. The assembler on the assembly line must exert a concerted effort to remove and replace the wrong microelectronic part. It is time-consuming and laborious.

SUMMARY OF THE INVENTION

The object of the present invention is to provide a peel-off device for an electronic-part delivery system which has a construction that can eliminate the aforesaid drawback resulting from the use of the peel-off device of the conventional electronic-part delivery system.

According to the present invention, an electronic-part delivery system is provided for delivering and placing an electronic part at a predetermined position, and includes a band carrier for delivering the electronic part that has an outer surface coated with adhesive means, and a transparent tape overlapping the band carrier in such a manner to cover and protect the electronic part. The delivery system further comprising: a peel-off device disposed above the band carrier, and having a front end portion that is adapted to contact slidably the band carrier and that is adapted to remove the transparent tape from the band carrier into a first direction when the band carrier moves with respect to the peel-off device in a second direction opposite to the first direction so as to expose the electronic part, the peel-off device further having a recess that is indented inwardly from the front end portion, that is formed through upper and lower surfaces of the front end portion and that has a width larger than that of the electronic part.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way off illustration only, and thus are not limitative of the present invention, and wherein.

DETAILED DESCRIPTION OF THE PREFERRED EMBODIMENT

Figure 1:
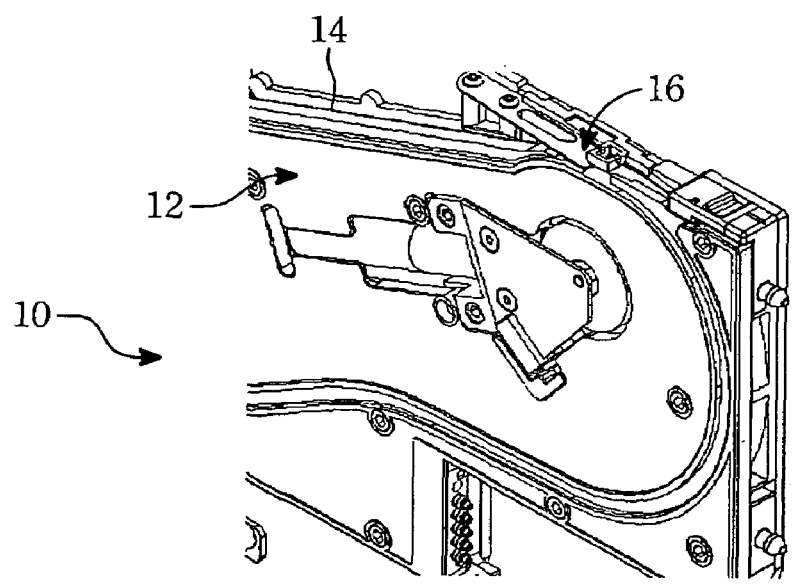
FIG. 1 is fragmentary perspective view of a conventional electronic-part delivering system.
Figure 2:
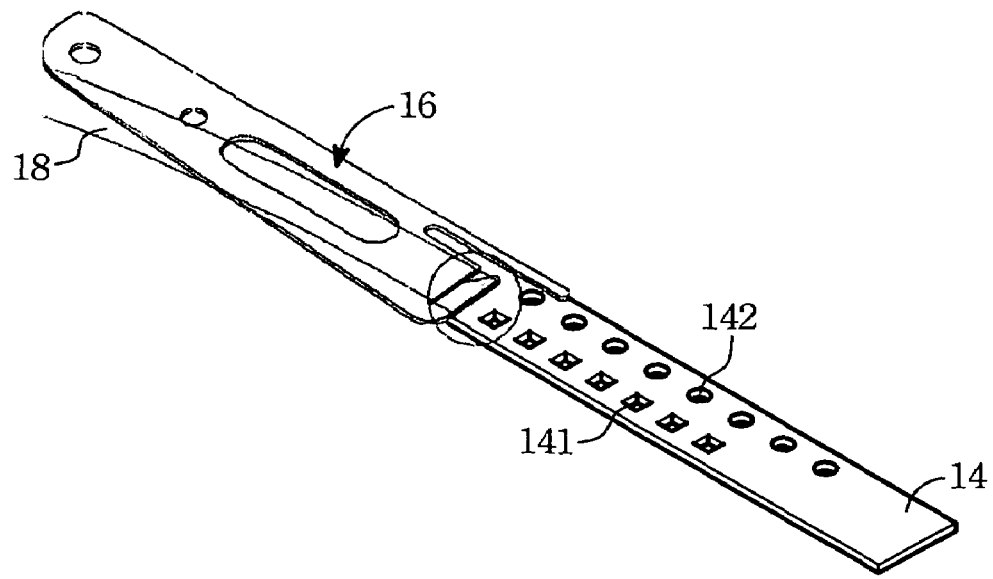
FIG. 2 is a perspective view, illustrating interrelationship between a peel-off device, a carrier band and a transparent tape employed in the conventional electronic-part delivery system of FIG. 1.
Figure 3:
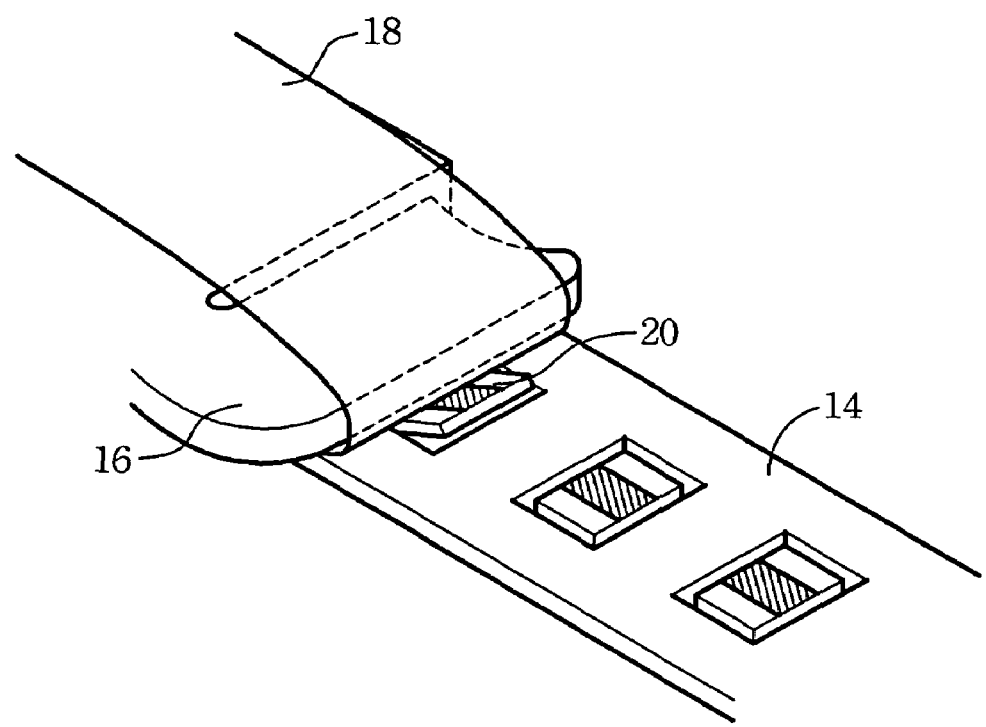
FIG. 3 is a perspective view, illustrating how an electron part turns upside down due to collision against the peel-off device during the tape peeling operation in the conventional electronic-part delivery system of FIG. 1.

The preferred embodiment of a delivery system according the present invention has a construction generally similar to that shown in FIG. 1, and includes a planar support tray (see FIG. 1), a conveyor belt (see FIG. 1) disposed adjacent to the support tray, a band carrier 14 for delivering an electronic part, a transparent tape 18 and a peel-off device 22. Since the structure of the support tray and the conveyer belt, and mounting and hooking of the band carrier 14 by the conveyer belt for delivering the former to a predetermined are not relevant to the present invention, a detailed description thereof are omitted herein for the same of brevity. Note that the electronic parts 20 disposed with the recesses of the band carrier 14 are of 0402 and 0603 specifications.

Figure 4:
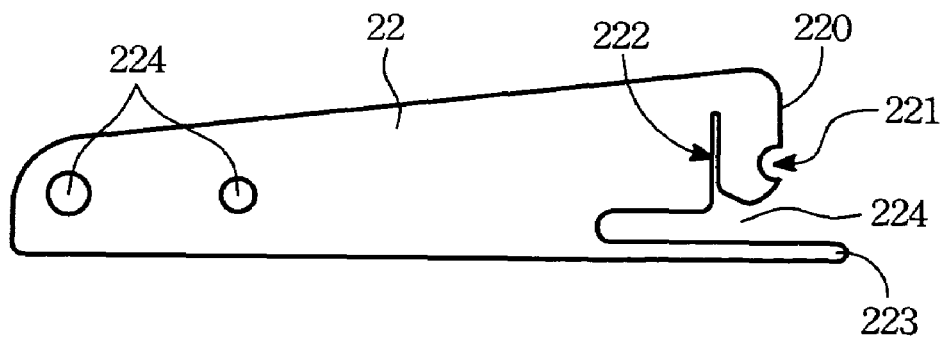
FIG. 4 is a top planar view of a peel-off device employed in the preferred embodiment of a delivery system according to the present invention.
Figure 5:
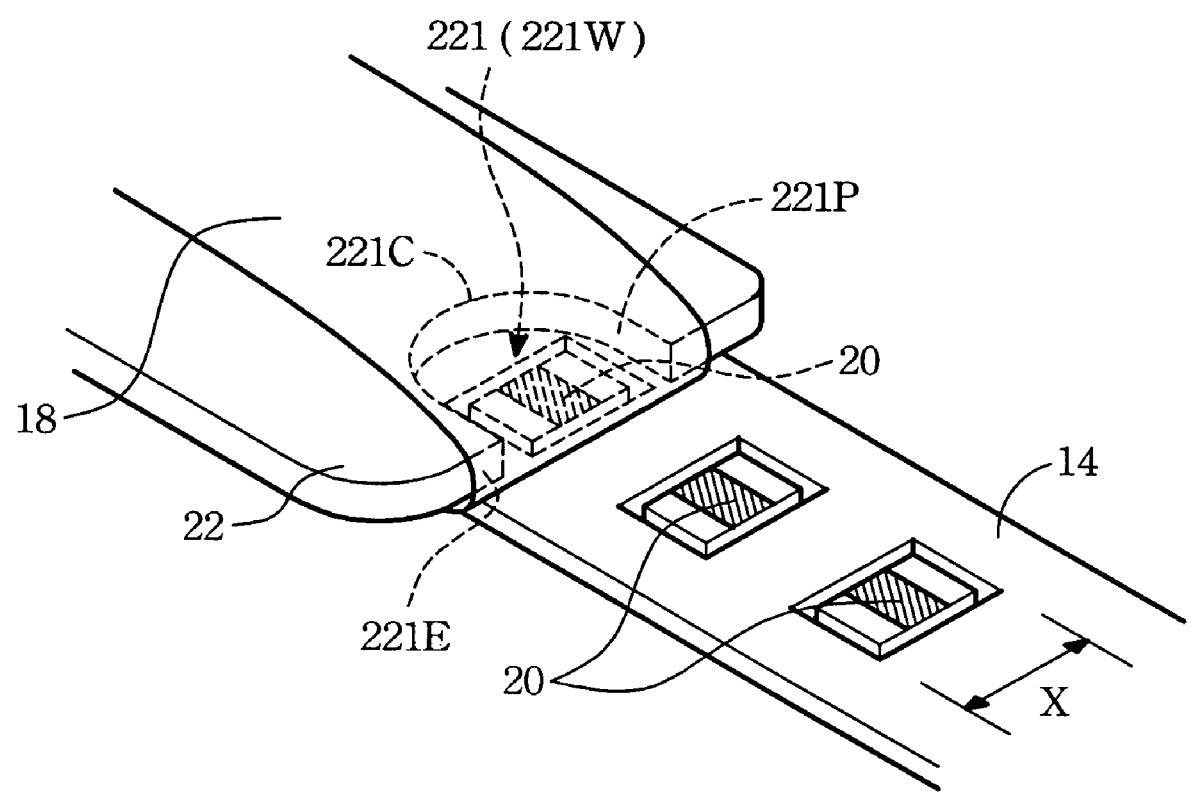
FIG. 5 is an enlarged perspective view, illustrating how a transparent tape is peeled off by the peel-off device shown in FIG. 4.

As illustrated in FIGS. 4 and 5, the peel-off device 22 is disposed above the band carrier 14 (see FIG. 1), and has a front end portion 220 and a recess 221 that is indented inwardly from a part of the front end portion 220 which contacts the transparent tape 18. The recess 221 is formed through upper and lower surfaces of the front end portion 220 and that has a width larger than that of the electronic part 20. The recess 221 is generally U-shaped and is defined by a recess-confining wall 221W that has two opposite ends 221E, two parallel straight wall portions 221P extending inwardly and respectively from the opposite ends 221E thereof and a curved wall portion 221C disposed between and interconnecting the parallel straight wall portions 221P. The opposite ends 221E of the recess-confining wall 221W are spaced apart from each other by a distance which is larger than the width (X) of the electronic part 20.

The curved wall portion 221C has a diameter ranging from 1.6 mm to 2 mm. Each of the parallel straight wall portions 221P has an axial length ranging from 0.4 to 0.5 mm measured from a respective one of the opposite ends 221E along a longitudinal length of the peel-off device. The peel-off device has an axial slot 224 extending inwardly from the front end portion 220 and a transverse slit 222 that is disposed rearwardly of the recess 221 and that is in spatial communication with the axial slot 224. The peel-off device 22 further has an axial extension 223 extending outwardly from the front end portion 220 adjacent to the axial slot 224. The rear end portion of the peel-off device 22 is formed two mounting hole 224 to permit extension of fastener screws for mounting the peel-off device 22 within the delivery system.

Referring to FIG. 5 again, during the delivery operation, the band carrier 14 is brought synchronously alongwith the conveyer belt by virtue of movement of the latter in a first direction while the transparent tape 18 is removed in a second direction opposite to the first direction such that the transparent tape 18 can be wound around a reel (not shown). Note that during movement of the carrier band 14 with respect to the peel-off device 22, since the dimension of the recess-confining wall 221W is greater that than of the electronic part 20, the electronic part 20 disposed within the recess in the carrier band 14 does not collide with the front end portion 220 of the peel-off device 22. There is no overturning of the electronic part 20 within the recess and the electronic part 20 is exposed in the status quo ante so as to facilitate fetching of the electronic part 20 by the suction device (not shown). If desired, the waste portion of the transparent tape 18 can be torn off by inserting the same through the transverse slit 222 in the peel-off device 22. The peeling-off operation of the transparent tape 18 generally goes smooth since the axial extension 223 of the peel-off device 22 slidably presses a peripheral edge of the band carrier 14 while the transparent tape 18 is being removed by the front end portion 220 of the peel-off device 22.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

We claim:

1. A peel-off device for use in an electronic-part delivery system which is used for delivering and placing an electronic part, and which includes a band carrier loaded with the electronic part and a transparent tape overlapping the band carrier so as to cover the electronic part, the peel-off device comprising:

a front end portion that is adapted to slidably contact the band carrier and to remove the transparent tape from the band carrier when the band carrier moves with respect to the peel-off device; and a recess sunk inwardly from a part of the front end portion which contacts the transparent tape, wherein the recess is formed through upper and lower surfaces of the front end portion and has a width larger than that of the electronic part, so as to prevent the peel-off device from colliding with the electronic part disposed within the band carrier, wherein the peel-off device has an axial slot extending inwardly from the front end portion and a transverse slit disposed rearward of said recess in spatial communication with said axial slot.

2. The peel-off device according to claim 1, wherein said recess in the peel-off device is generally U-shaped.

3. The peel-off device according to claim 2, wherein said recess in the peel-off device is defined by a recess-confining wall that has two opposite ends, two parallel straight wall portions extending inwardly and respectively from said opposite ends thereof, and a curved wall portion disposed between and interconnecting said parallel straight wall portions.

4. The peel-off device according to claim 3, wherein said curved wall portion has a diameter ranging from 1.6 mm to 2 mm, and each of said parallel straight wall portions has an axial length ranging from 0.4 to 0.5 mm measured from a respective one of said opposite ends along a longitudinal length of the peel-off device.

5. The peel-off device according to claim 3, wherein the peel-off device further has an axial extension which extends outwardly from the front end portion adjacent to said axial slot, for pressing the band carrier during movement of the band carrier with respect to the peel-off device so as to enhance removal of the transparent tape from the band carrier.

6. The peel-off device according to claim 1, wherein the peel-off device has a rear end portion opposite to said front end portion, said rear end portion of said peel-off device being formed with one mounting hole to permit extension of a fastener screw for mounting the peel-off device within the electronic-part delivery system.

7. An electronic-part delivery system which includes a band carrier for delivering an electronic part that has an outer surface coated with adhesive means, and a transparent tape overlapping the band carrier in such a manner so as to cover and protect the electronic part, the delivery system comprising:
a peel-off device adapted to be disposed above the band carrier and having a front end portion that is adapted to slidably contact the band carrier and remove the transparent tape from the band carrier into a first direction when the band carrier moves with respect to the peel-off device in a second direction opposite to the first direction so as to expose the electronic part, said peel-off device further having a recess indented inwardly from a part of the front end portion which contacts the transparent tape, and which is formed through upper and lower surfaces of the front end portion and has a width larger than that of the electronic part, so as to prevent the peel-off device from colliding with the electronic part disposed within the band carriers,
wherein said recess is defined by a recess-confining wall that has two opposite ends, two parallel straight wall portions extending inwardly and respectively from said opposite ends thereof, and a curved wall portion disposed between and interconnecting said parallel straight wall portions, and said curved wall portion has a diameter ranging from 1.6 mm to 2 mm and each of said parallel straight wall portions has a length ranging from 0.4 to 0.5 mm measured from a respective one of said opposite ends along a longitudinal length of the peel-off device.

8. The electronic-part delivery system according to claim 7, wherein said recess in said peel-off device is generally U-shaped.

9. The electronic-part delivery system according to claim 7, wherein the peel-off device further has an axial extension extending outwardly from the front end portion for pressing the band carrier during movement of the band carrier with respect to the peel-off device, so as to enhance removal of the transparent tape from the band carrier.

* * * * *